(12) United States Patent
Roopnarine

(10) Patent No.: US 9,689,764 B1
(45) Date of Patent: Jun. 27, 2017

(54) FLEXURE-BASED SYSTEM FOR MEASURING TORQUE ON A SHAFT

(71) Applicant: Roopnarine, New York, NY (US)

(72) Inventor: Roopnarine, New York, NY (US)

( * ) Notice: Subject to any disclaimer, the term of this patent is extended or adjusted under 35 U.S.C. 154(b) by 0 days.

(21) Appl. No.: 14/961,870

(22) Filed: Dec. 7, 2015

(51) Int. Cl.
  *G01L 3/02* (2006.01)
  *G01L 3/10* (2006.01)
  *G01L 9/00* (2006.01)
  *G01R 33/09* (2006.01)

(52) U.S. Cl.
  CPC .............. *G01L 3/104* (2013.01); *G01L 9/007* (2013.01); *G01R 33/09* (2013.01)

(58) Field of Classification Search
  CPC .......... G01L 9/007; G01L 3/104; G01R 33/09
  USPC ...................................... 73/862.331–862.336
  See application file for complete search history.

(56) References Cited

U.S. PATENT DOCUMENTS

| | | | | |
|---|---|---|---|---|
| 4,796,463 A | * | 1/1989 | Tsals ....................... | G01L 5/221 73/862.332 |
| 6,430,440 B1 | * | 8/2002 | McNeil, II ......... | A61N 1/36542 607/19 |
| 6,694,828 B1 | * | 2/2004 | Nicot ...................... | B62D 1/16 180/422 |
| 7,049,808 B2 | * | 5/2006 | Martinez ................ | G01D 5/145 324/207.25 |
| 7,078,893 B2 | * | 7/2006 | Nakano .................. | G01D 5/145 324/207.25 |

* cited by examiner

*Primary Examiner* — Max Noori

(57) ABSTRACT

A sensing device for detecting the amount of torque transmitted through a shaft. The device has a first and second section interconnected by a flexure arrangement to which permanent magnets are attached. Deflections of the flexures produce a repeatable and proportional change of magnetic flux which flows in a stationary annular ring that is concentrically mounted with respect to the shaft and separated from it by an air gap. The annular ring is instrumented with an array of magnetic field sensors that measure the changing magnetic flux.

14 Claims, 5 Drawing Sheets

FLEXURE-BASED SYSTEM FOR MEASURING TORQUE ON A SHAFT

This U.S. Patent Application claims the priority of U.S. Provisional Patent Application 62/088,225, filed on Dec. 5, 2014.

TECHNICAL FIELD

This disclosure is in the field of sensors that are placed inline with a rotating shaft to determine the transmitted torque without contact and therefore without the use of slip rings, twist capsules or cable wraps.

BACKGROUND

In the control of a shaft driven by a motor or actuator, the position, speed and torque applied to the shaft are parameters of most interest in closing the feedback loop of the system or device. There is, therefore, need for a device that can provide these measurements without contacting the shaft as these are often not very reliable, may be expensive to implement and necessarily require the use of a slip ring or twist capsule to obtain an output electronic signal for processing. One typical contact measurement method uses strain gages which are attached to the shaft of interest; when torsional stress is applied to the shaft, resistance changes in the gages are measured in a Wheatstone bridge and this correlates to a torque value. U.S. Pat. Nos. 6,553,847, 6,260,423 and 6,145,387 to Garshelis teach non-contacting methods for measuring torque on a shaft. However, each of the referenced patents utilize complex magnetic material formulations, either as permanent magnets or as members that must exhibit magnetostriction, in order to achieve the desired data. Furthermore, complex manufacturing and/or assembly processes render these devices costly for use in mass production markets. As such, there is a need for a relatively low cost, compact, rugged sensor for determining torque, speed and position of a shaft when it is placed in line with the shaft.

SUMMARY OF INVENTION

The invention is a sensor that provides a means of measuring the torque and speed of a rotating shaft. The sensor has a first or input side and a second or output side; each side is coupled, inline, to the shaft of interest. Rotationally coupling the input and output sections of the sensor is a flexure arrangement. At least one pair of permanent magnets is attached to one end of the flexures. The flexures permit the transmission of force and therefore torque from the first (input) section to the second (output) section and vice-versa. The flexures are effectively cantilever beams that are appropriately sized for the torque to be transmitted and for low stresses and they also act as springs that maintain contact with the mating parts of the first (input) section. Hard stops may be used to prevent over loading the flexure beams. The beams may be a composite of a suitably flexible non-magnetic material to which a magnetically soft material is attached or abuts such that the assembly deflects as either one piece or such that deflections of the former produces a predictable deflection of the latter. The obvious preference is for the flexure to be of a unitary construction from a magnetic or ferromagnetic material. To further reduce stress on the flexures, an arrangement in which there are multiple paired but independent flexure beams axially spaced or offset from each other, is also possible. Depending on the strength of magnets used in the system, the additional flexures may or may not have permanent magnets attached to them. Specifically, with lower energy magnets (e.g., Alnico or Ceramic), additional magnets may be used in order to increase the amount of flux present in the magnetic circuit.

Other objects, features, and advantages of the present invention will be explained in the following detailed description of the invention having reference to the appended drawings.

DETAILED DESCRIPTION OF INVENTION

In the following detailed description of the invention, certain preferred embodiments are illustrated providing certain specific details of their implementation. However, it will be recognized by one skilled in the art that many other variations and modifications may be made given the disclosed principles of the invention.

Figure 1:
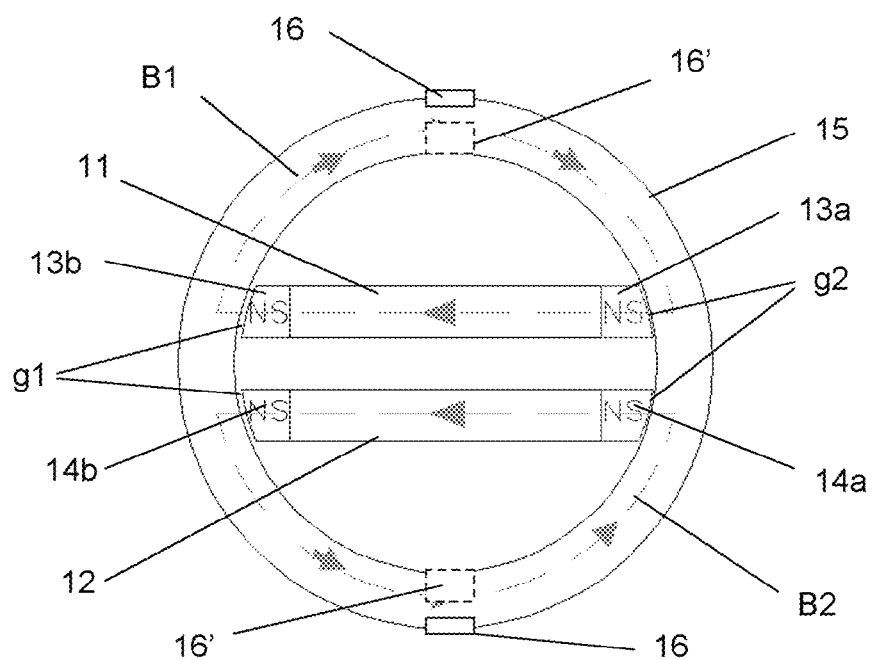
FIG. 1 is a schematic showing the key principle of the sensor.

Referring to the schematic view shown in FIG. 1, the sensor 10 has two flexure beams 11, 12 with magnet pairs 13, 14 attached and configured (pole-wise), as shown. The magnets 13a, 13b and 14a, 14b are attached such that opposing poles are in contact with the flexure beams 11 and 12, respectively. So, for example, if first magnet 13a is mounted with its North pole in contact with flexure beam 11, at the opposite end, second magnet 13b will be mounted with its South pole in contact with the beam. It is necessary that the N-S arrangement, with respect to the flexure beams 11 and 12, stay the same for both beams. The magnets 13a, 13b, 14a and 14b may be of any type, e.g., ceramic, alnico, neodymium iron boron or samarium cobalt. It is understood that cost-effectiveness in certain applications will determine the selection of magnet type to be used in the sensor. If a sufficiently high energy magnet is used, for example, neodymium iron boron, only two magnets 13a and 14a (rather than four), can be used in the system. This will further decrease manufacturing operations and potentially offset the cost of the more expensive rare-earth material.

The magnetic fields B1, B2 from the magnets want to seek a closed path, through air gaps g1 and g2, via the sensing ring 15. Sensing ring 15 has an array 16 or 16' of magnetic field sensors, for example, Hall effect sensors or magnetometers, embedded in it; these sensors are capable of sensing changes in the magnetic field that flows inside the ring. The magnetic field sensors 16, 16' may be embedded on the inner diameter, outer diameter or face of the sensing ring 15 and as noted, are in arrays with multiple sensors equally spaced around the sensing ring 15. The more sensors used in an array, the better the resolution with which the torque, position and speed of the shaft can be determined. Because the flexure beams 11 and 12 must deflect outwardly towards the inner diameter of sensing ring 15, the air gap g1 may be different and larger than the air gap g2. The air gap g1 is dependent on the maximum acceptable deflection of the flexure beams; the nominal configuration of the sensor is for air gap g2 to be equal to air gap g1. The sensing ring 15, made of a ferromagnetic or magnetically soft material, e.g., Hiperco® or Somaloy®, is mounted to a physical ground such that it is concentric with the shafts and flexure assembly in order to maintain the air gaps g1 and g2 between the outer diameter of the mounted magnets and its inner diameter.

A flexure beam 11, 12 detects either clockwise or counter-clockwise torques. When a torque, T (in.lb), is applied to the input shaft, the derived force, F (lb), deflects the corresponding flexure beam in order to transmit the torque to the output side. The force, F (lb)=T/r, in which r is the radius, in inches, from the center of the sensor to the point of contact between the tab and the flexure beam. The related deflection, d, of the flexure beam at the point of contact with the tab is given as, d (in)=$FL^3/(3EI)$ in which L=r (in), E is the Young's Modulus (psi) of the material used and I is the moment of inertia ($in^4$) of the beam's cross section. The amount of deflection in the system is limited by the safe stress that can be applied for the specific material and depending on the desired life of the sensor, fatigue stresses must also be considered. However, the deflection, d, is thus proportional to the amount of torque applied and therefore to the movement of the magnets or more precisely to changes in the magnetic field. The two fields, B1 and B2 are nominally equal when the sensor is unloaded, that is, when there is no deflection of the flexure beams. As a flexure beam deflects under load, however, the movement shortens the air gap with respect to the sensing ring 15 inner diameter. This, in turn, increases the magnetic field in the ring and the two fields B1 and B2 become unequal; it is this change that is measured by the embedded magnetic field sensors. These sensors would typically be analog types. A second set of sensors, also embedded in the sensing ring, would typically be digital and their purpose would be to detect rotation and therefore speed of rotation of the shaft assembly. It is possible, with sufficient processing power, to deduce the speed of rotation of the shaft without using a digital set of sensors. A single sensor type that offers both digital and analog outputs is preferred.

Figure 2A:
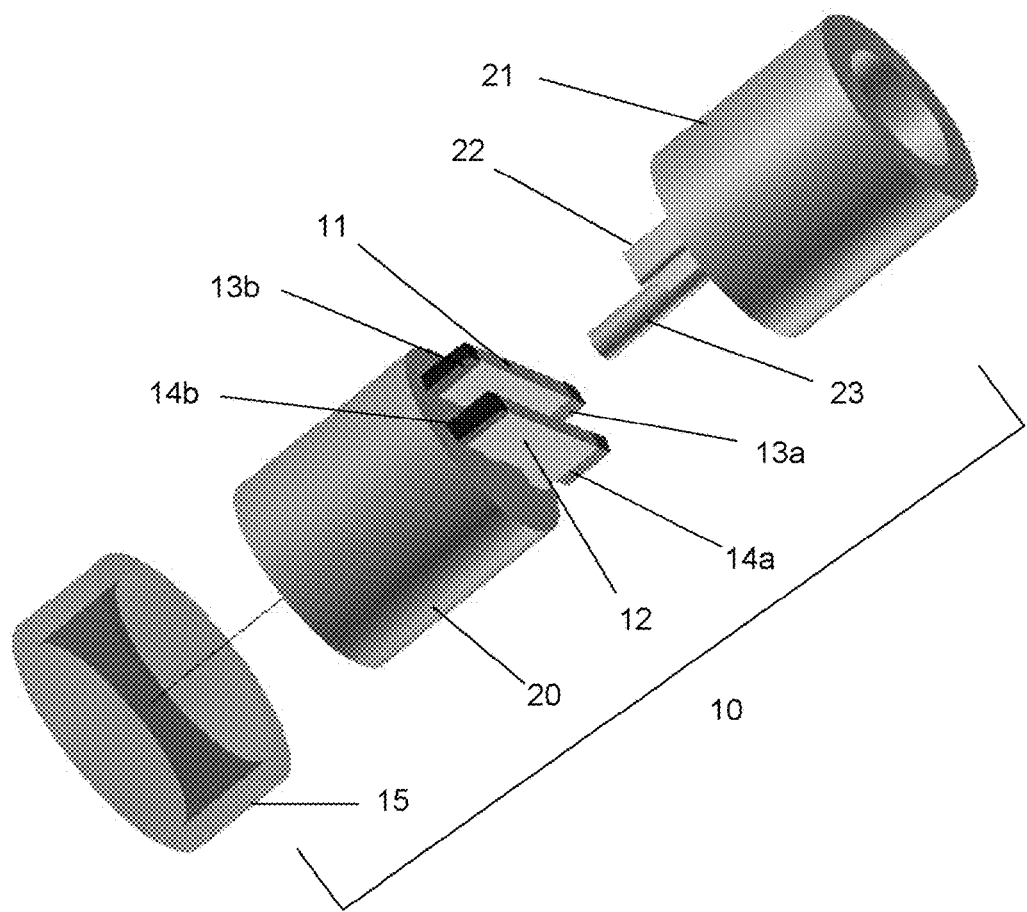
FIG. 2a is an exploded view of the preferred embodiment.
Figure 2B:
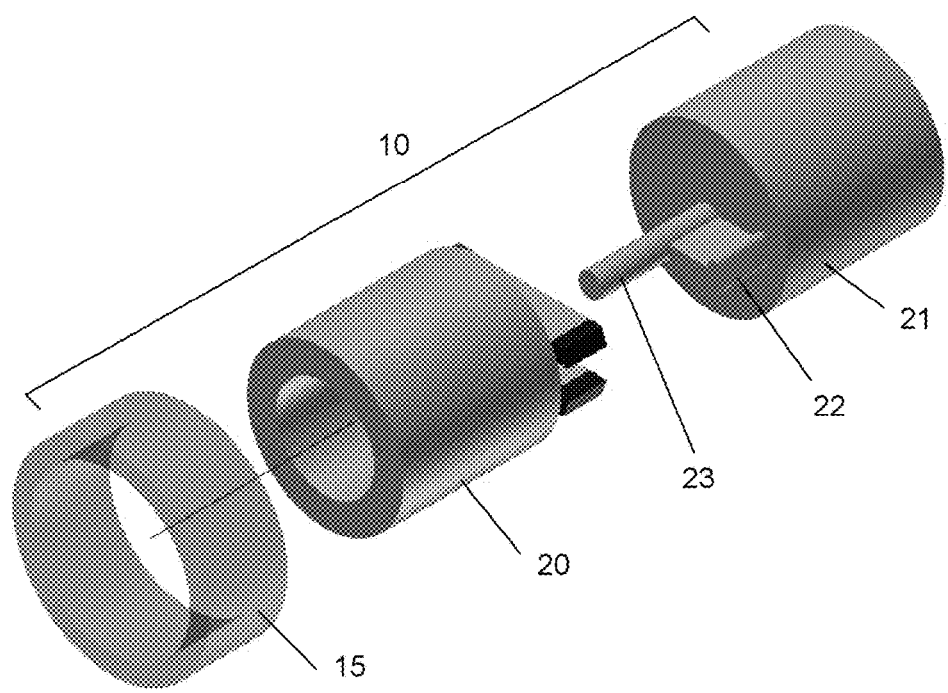
FIG. 2b is a second exploded view of the preferred embodiment.
Figure 2C:
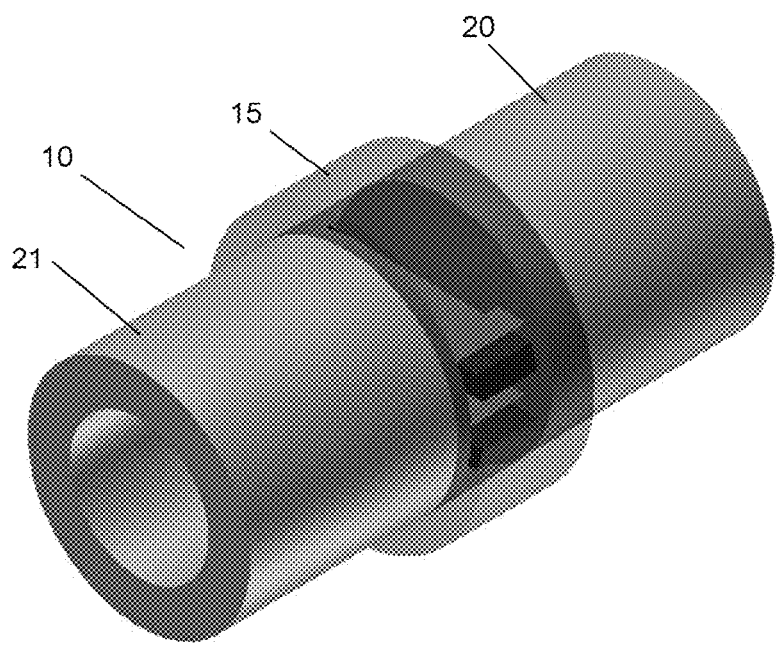
FIG. 2c is a fully assembled view of the preferred embodiment.

To practically facilitate the magnetic circuit of FIG. 1, the two flexure beams 11 and 12 are shown on the output sensor hub or shaft section 20 of FIG. 2a, FIG. 2b and FIG. 2c. The flexure beams 11 and 12 may be integrally formed on output sensor hub or shaft section 20 from a magnetically soft or ferromagnetic material; however, they may also be formed on a separate part which is then mechanically fastened to an essentially cylindrical part to form an assembly that has all the features of shaft section 20. This arrangement provides maximum flexibility in selecting the material for the flexure beams which must be ferromagnetic or magnetically soft. Each flexure beam may be initially preloaded against tab 22 on the input sensor hub or shaft section 21. Ideally, the tab 22 contacting the flexure beams 11 and 12 will be one or more rollers (not shown) such that friction and potentially hysteresis may be reduced in the sensor. The roller(s) can be pinned to an essentially cylindrical part such that they are free to rotate with respect to the pin with all other features common to input shaft section 21. The roller(s) must be manufactured from a material that is not magnetic, for example, 303 stainless steel, aluminum, titanium, etc. The input sensor hub or shaft section 21 has an extension shaft 23, beyond the tab 22, that is inserted into and through the output sensor hub or shaft section 20. The extension shaft 23 serves two functions: (1) to concentrically align and rotationally constrain the input sensor hub or shaft section 21 to the output sensor hub or shaft section 20 and (2) to maintain axial position of the two sections 20 and 21, with respect to each other. In order to perform these functions, the extension shaft 23 is supported on a bearing(s) that are housed in the output sensor hub or shaft section 20 (bearings not shown in figures). Depending on the precision requirements for the sensor, the bearing arrangement may be of any type, e.g., needle roller, ball, roller, a bushing or a combination of these. The extension shaft 23 is thus supported on the inner race of the bearing(s) with axial loads reacted through the bearing by the use of a retaining ring, locknut or a flanged screw or washer and screw. The retaining ring, locknut, flanged screw or washer and screw also secures the two shaft or hub sections together to form an assembly over which the sensing ring 15 is positioned. In order to maintain the air gaps g1 and g2, a thin-walled spacer or bushing or ball bearing (not shown in figures) is used to coaxially and concentrically locate the sensing ring 15 with respect to either the input sensor hub or shaft section 21 or to the output sensor hub or shaft section 20 or to both.

Figure 3A:
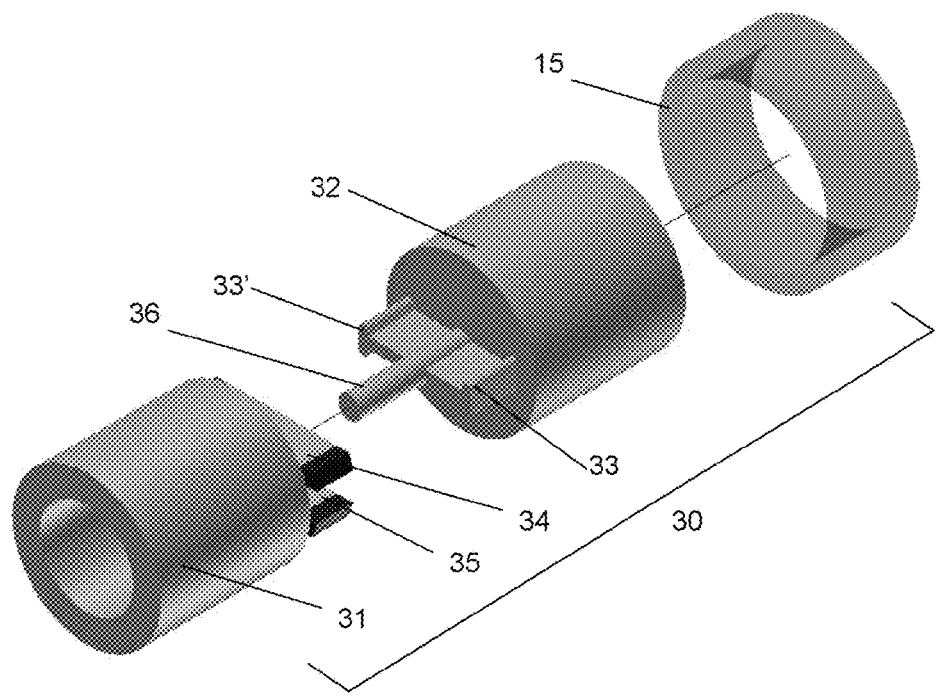
FIG. 3a is a first exploded view of a second embodiment of the invention.
Figure 3B:
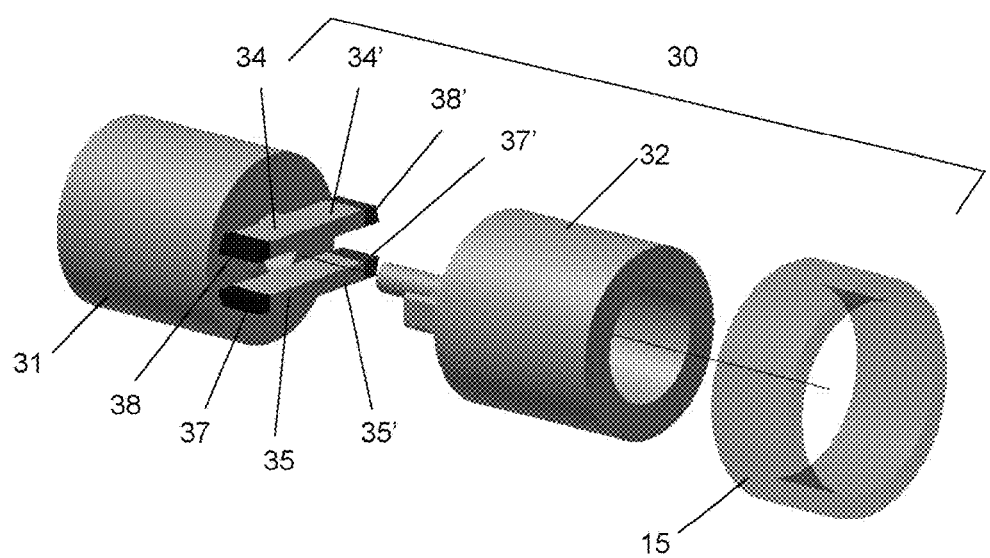
FIG. 3b is a second exploded view of a second embodiment of the invention.
Figure 3C:
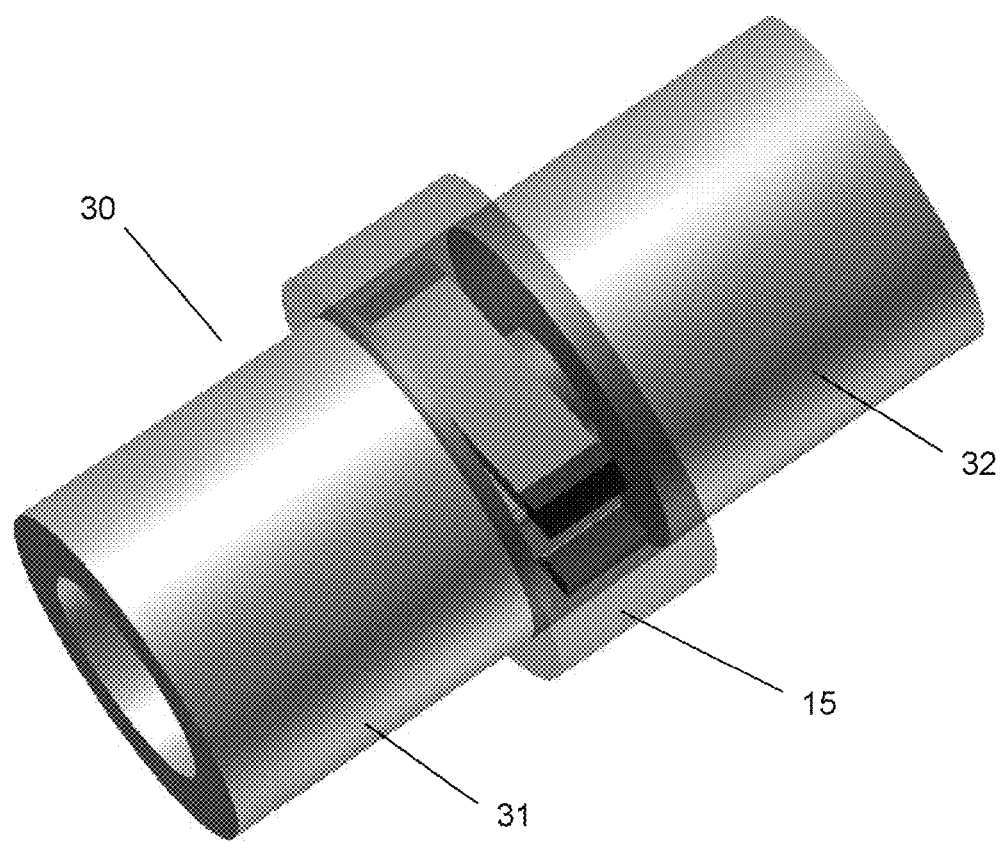
FIG. 3c is a fully assembled view of a second embodiment of the invention.

The exploded views of FIG. 3a and FIG. 3b and the assembly view of FIG. 3c, depict another embodiment of the sensor 30 in which there is a total of four flexure beams 34, 34', 35, 35' on the output sensor hub or shaft section 31. Correspondingly, there are two radial tabs 33 and 33' that are inserted in between the flexure beams, during assembly, such that rotation of the tabs with respect to the flexure beams produce deflection of the beams. Attached to the ends of the flexure beams are magnets 37, 37', 38, 38' with their poles arranged as in the main embodiment of the invention; the magnetic circuit and theory of operation of this configuration are also similar. However, there are still only two beams as seen by the magnetic circuit and only a single air gap is possible. In this arrangement, the flexure beams are grounded to the shaft near its center and extend outward towards the inner diameter of the sensing ring.

As disclosed above, it is possible to establish the speed of rotation or position of the shaft with respect to the mechanically fixed sensing ring 15 if the device is configured as an array with multiple sensors. However, the speed of the shaft may also be measured by attaching one or more permanent magnets to the shaft and installing an array of Hall effect sensors on the sensing ring 15. Alternatively, any standard, commercially available speed sensor (e.g., encoder, resolver, etc.) can be adapted for this purpose.

It is understood that many modifications and variations may be devised given the above description of the principles of the invention. It is intended that all such modifications and variations be considered as within the spirit and scope of this invention, as defined in the following claims.

The invention claimed is:

1. A sensor for measuring the amount of torque transmitted through a coupled shaft that is comprised of a first section and a second section in which:
   the first section is mechanically fixed to the second to form a single assembly wherein said assembly permits relative rotation between the two sections under the influence of a torque with said first section having protruding non-magnetic tabs and said second section having ferromagnetic flexures that cooperate together so as to transfer torque from the first section to the second section in which said torque produces deflection of a flexure beam to which at least one permanent magnet is attached such that said deflection will reduce an air gap between the permanent magnet and a ferromagnetic stationary sensing ring onto which is embedded an array of magnetic field sensors with said magnetic field sensors capable of detecting changes in the magnetic field flowing through said sensing ring.

2. A sensor according to claim 1 in which with two or more flexure beams are integrally formed on the second section on a face perpendicular to the axis of rotation said flexure beams having equal dimensions and parallel axes equidistantly offset from said axis of rotation.

3. A sensor according to claim 1, in which the first section is formed with a radial tab projecting from one face perpendicular to the axis of rotation the width of said tab being nominally equal to the distance between the flexure beams.

4. A sensor according to claim 1 in which the first section is formed with a shaft extending beyond the projecting tab the diameter of said shaft being less than the width of the tab.

5. A sensor according to claim 1 in which the projecting tab of the first section is replaced by a roller with a diameter nominally equal to the space between the flexure beams said roller being pinned to the section and free to rotate thereon.

6. A sensor according to claim 1 in which the two or more flexure beams are formed as a separate part on a face perpendicular to the axis of rotation said flexure beams having equal dimensions and parallel axes equidistantly offset from said axis of rotation and that is then mechanically fastened to a second part to form an assembly that is the second section.

7. A sensor according to claim 1 in which the sensing ring is manufactured from a ferromagnetic or magnetically soft material.

8. A sensor according to claim 1 in which an equally spaced array of magnetic field sensors, for example, Hall effect sensors, are embedded said sensors being capable of detecting magnetic fields present in said sensing ring.

9. A sensor according to claim 1 in which said first section is held together axially and constrained concentrically with said second section to act as an assembly via an extension shaft on said first section and at least one bearing housed in said second section with said extension shaft axially fixed or retained with respect to the inner race of said bearing.

10. A sensor according to claim 1 in which said second section is manufactured from a ferromagnetic or magnetically soft material.

11. A sensor according to claim 6 in which said flexure beams are manufactured from a ferromagnetic or magnetically soft material.

12. A sensor according to claim 1 in which the sensing ring is held axially and constrained concentrically with said first section to act as an assembly via at least one bearing supported on its outer race by said sensing ring and on its inner race on said first section.

13. A sensor according to claim 1 in which said first section is manufactured from a non-magnetic material.

14. A sensor according to claim 5 in which the roller is manufactured from a non-magnetic material.

* * * * *